United States Patent
Min et al.

(10) Patent No.: US 11,490,512 B2
(45) Date of Patent: Nov. 1, 2022

(54) PRINTED CIRCUIT BOARD AND ANTENNA MODULE COMPRISING THE SAME

(71) Applicant: SAMSUNG ELECTRO-MECHANICS CO., LTD., Suwon-si (KR)

(72) Inventors: Tae Hong Min, Suwon-si (KR); Ju Ho Kim, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 172 days.

(21) Appl. No.: 16/794,741

(22) Filed: Feb. 19, 2020

(65) Prior Publication Data

US 2021/0076492 A1 Mar. 11, 2021

(30) Foreign Application Priority Data

Sep. 11, 2019 (KR) .......................... 10-2019-0113081

(51) Int. Cl.
*H05K 1/03* (2006.01)
*H05K 1/05* (2006.01)

(52) U.S. Cl.
CPC ............. *H05K 1/0393* (2013.01); *H05K 1/05* (2013.01); *H05K 2201/0141* (2013.01); *H05K 2201/0195* (2013.01); *H05K 2201/095* (2013.01)

(58) Field of Classification Search
CPC .... H05K 1/0195; H05K 1/0278; H05K 1/028; H05K 1/09063
See application file for complete search history.

(56) References Cited

U.S. PATENT DOCUMENTS

2002/0076951 A1* 6/2002 Roy ....................... H01R 12/57
257/E23.068
2007/0281505 A1* 12/2007 Kobayashi ........... H05K 3/4691
156/281
(Continued)

FOREIGN PATENT DOCUMENTS

JP 2007-128970 A 5/2007
JP 2013098536 A * 5/2013 ............... G02B 7/28
(Continued)

OTHER PUBLICATIONS

Notice of Office Action dated Oct. 29, 2020 in Korean Patent Application No. 10-2019-0113081 (English Translation).

*Primary Examiner* — Paresh Paghadal
(74) *Attorney, Agent, or Firm* — Morgan, Lewis & Bockius LLP

(57) ABSTRACT

A printed circuit board and an antenna module including the same are provided. The printed circuit board includes a core layer; a first build-up structure disposed on an upper side of the core layer, including first insulating layers and first bonding layers, alternately stacked, and further including first wiring layers disposed on upper surfaces of the first insulating layers, respectively, and embedded in the first bonding layers, respectively; and a second build-up structure disposed on a lower side of the core layer, including second insulating layers and second bonding layers, alternately stacked, and further including second wiring layers disposed on lower surfaces of the second insulating layers, respectively, and embedded in the second bonding layers, respectively. The printed circuit board has a through-portion penetrating through the core layer and the second build-up structure, and has a region in which the through-portion is disposed as a flexible region.

20 Claims, 6 Drawing Sheets

(56) References Cited

U.S. PATENT DOCUMENTS

| | | | |
|---|---|---|---|
| 2008/0196933 A1* | 8/2008 | Bois | H05K 1/024 |
| | | | 29/829 |
| 2010/0025086 A1* | 2/2010 | Stahr | H05K 3/4691 |
| | | | 174/254 |
| 2010/0065318 A1* | 3/2010 | Nagasawa | H05K 1/115 |
| | | | 174/262 |
| 2010/0243299 A1* | 9/2010 | Kariya | H01L 21/486 |
| | | | 156/247 |
| 2011/0272177 A1 | 11/2011 | Weichslberger et al. | |
| 2013/0276969 A1* | 10/2013 | Chang | B32B 38/10 |
| | | | 156/250 |
| 2014/0182899 A1* | 7/2014 | Li | H05K 3/4691 |
| | | | 156/92 |
| 2014/0268594 A1* | 9/2014 | Wang | H05K 1/183 |
| | | | 29/841 |
| 2017/0256497 A1* | 9/2017 | Mano | H05K 1/115 |
| 2020/0235478 A1* | 7/2020 | Kitamura | H01Q 21/065 |

FOREIGN PATENT DOCUMENTS

| | | |
|---|---|---|
| JP | 2015-126182 A | 7/2015 |
| JP | 2019-087987 A | 6/2019 |
| KR | 10-2011-0113732 A | 10/2011 |
| KR | 10-2016-0130290 A | 11/2016 |
| KR | 10-2018-0130905 A | 12/2018 |
| WO | 2015/171118 A1 | 11/2015 |

* cited by examiner

PRINTED CIRCUIT BOARD AND ANTENNA MODULE COMPRISING THE SAME

CROSS-REFERENCE TO RELATED APPLICATION(S)

This application claims benefit of priority to Korean Patent Application No. 10-2019-0113081 filed on Sep. 11, 2019 in the Korean Intellectual Property Office, the disclosure of which is incorporated herein by reference in its entirety.

TECHNICAL FIELD

The present disclosure relates to a printed circuit board, for example, a printed circuit board that can be used for an antenna module, and an antenna module including the same.

BACKGROUND

Data traffic of mobile communication is increasing rapidly every year. Active technological development to support such rapid data in real time in wireless networks is underway. For example, contentrization of internet of thing (IoT)-based data, live AR/VR combined with augmented reality (AR), virtual reality (VR), and social network service (SNS), autonomous driving, and applications such as sync view, or the like, using a miniature camera, which transmits real-time video, require wireless communications (e.g, 5G communication, mmWave communication, etc.) to support an exchange of large amounts of data. Therefore, recently, millimeter wave (mmWave) communication including $5^{th}$ generation (5G) has been actively researched, and studies for commercialization and standardization of antenna modules for smoothly implementing the same have been also actively conducted.

On the other hand, radio frequency (RF) signals of high frequency bands (e.g., 28 GHz, 36 GHz, 39 GHz, 60 GHz, etc.) are easily absorbed and lead to loss in the process of being transmitted, resulting in a drastic drop in communications quality. Therefore, the antenna for communication in a high frequency band requires a different technical approach from that of existing antenna technology, and, for example, may require a special technical development such as securing a gain of an antenna, integrating the antenna with a radio frequency integrated circuit (RFIC), a separate power amplifier for securing effective isotropic radiated power (EIRP), and the like.

SUMMARY

An aspect of the present disclosure is to provide a printed circuit board, that can be modularized by placing a chip antenna and a wireless chip in a surface-mounted form, and can be used as a rigid flexible printed circuit board (RFPCB), having a flexible area, and an antenna module using such a printed circuit board.

According to an aspect of the present disclosure, a printed circuit board includes a core layer, a first build-up structure disposed on an upper side of the core layer, including a plurality of first insulating layers and plurality of first bonding layers, alternately stacked, and further including a plurality of first wiring layers disposed on upper surfaces of the first insulating layers and embedded in the first bonding layers, respectively; and a second build-up structure disposed on a lower side of the core layer, including a plurality of second insulating layers and a plurality of second bonding layers, alternately stacked, and further including a plurality of second wiring layers disposed on lower surfaces of the second insulating layers and embedded in the second wiring layers, respectively. The printed circuit board has a through-portion penetrating through the core layer and the second build-up structure, and has a region in which the through-portion is disposed as a flexible region.

According to an aspect of the present disclosure, an antenna module includes a printed circuit board including a plurality of base regions including a core layer, a plurality of first build-up layers disposed on an upper surface of the core layer, a plurality of first wiring layers disposed on the plurality of first build-up layers, respectively, a plurality of second build-up layers disposed on a lower surface of the core layer, and a plurality of second wiring layers disposed on the plurality of second build-up layers, respectively, and at least one flexible region disposed between the plurality of base regions, including the plurality of first build-up layers and the plurality of first wiring layers, and having a through-portion penetrating through the core layer and the plurality of second build-up layers, wherein the core layer has a greater elastic modulus than each of the first build-up layer and the second build-up layer; a chip antenna disposed on an upper side of at least one of the plurality of base regions of the printed circuit board; and a wireless communication chip disposed on a lower side of at least one of the plurality of base regions of the printed circuit board.

According to an aspect of the present disclosure, a printed circuit board includes a core layer, first build-up layers disposed on an upper surface of the core layer, first wiring layers disposed on the first build-up layers, respectively, second build-up layers disposed on a lower surface of the core layer, second wiring layers disposed on the second build-up layers, respectively, and a passivation layer having openings exposing a portion of pads of an uppermost one of the first wiring layers. The printed circuit board has a through-portion penetrating through the core layer and the second build-up layers, and has a region in which the through-portion is disposed as a flexible region. The openings are spaced apart from the flexible region.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, embodiments of the present disclosure will be described as follows with reference to the attached drawings.

Electronic Device

Figure 1:
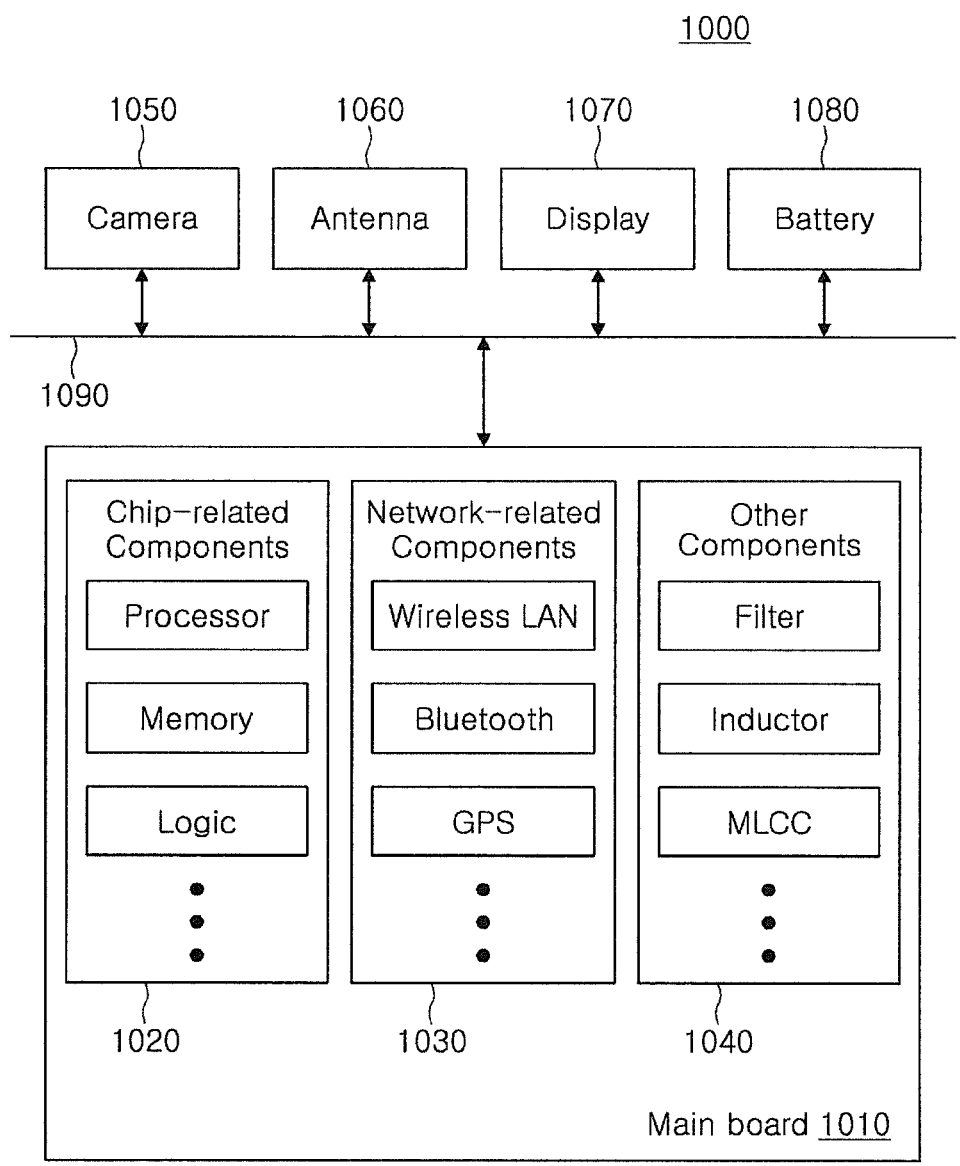
FIG. 1 is a schematic block diagram illustrating an example of an electronic device system.

FIG. 1 is a schematic block diagram illustrating an example of an electronic device system.

Referring to FIG. 1, an electronic device 1000 may receive a main board 1010. The main board 1010 may include chip related components 1020, network related components 1030, other components 1040, or the like, physically or electrically connected thereto. These components maybe connected to others to be described below to form various signal lines 1090.

The chip associated components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter, an application-specific integrated circuit (ASIC), or the like, or the like. However, the chip associated components 1020 are not limited thereto, and may include other types of chip associated components. In addition, the chip-associated components 1020 may be combined with each other.

The network associated components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+(HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth®, 3G, 4G, and 5G protocols, and any other wireless and wired protocols, designated after the abovementioned protocols. However, the network associated components 1030 are not limited thereto, but may also include a variety of other wireless or wired standards or protocols. In addition, the network associated components 1030 may be combined with each other, together with the chip associated components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 includes other components that may or may not be physically or electrically connected to the main board 1010. These other components may include, for example, a camera 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device able to process data.

Figure 2:
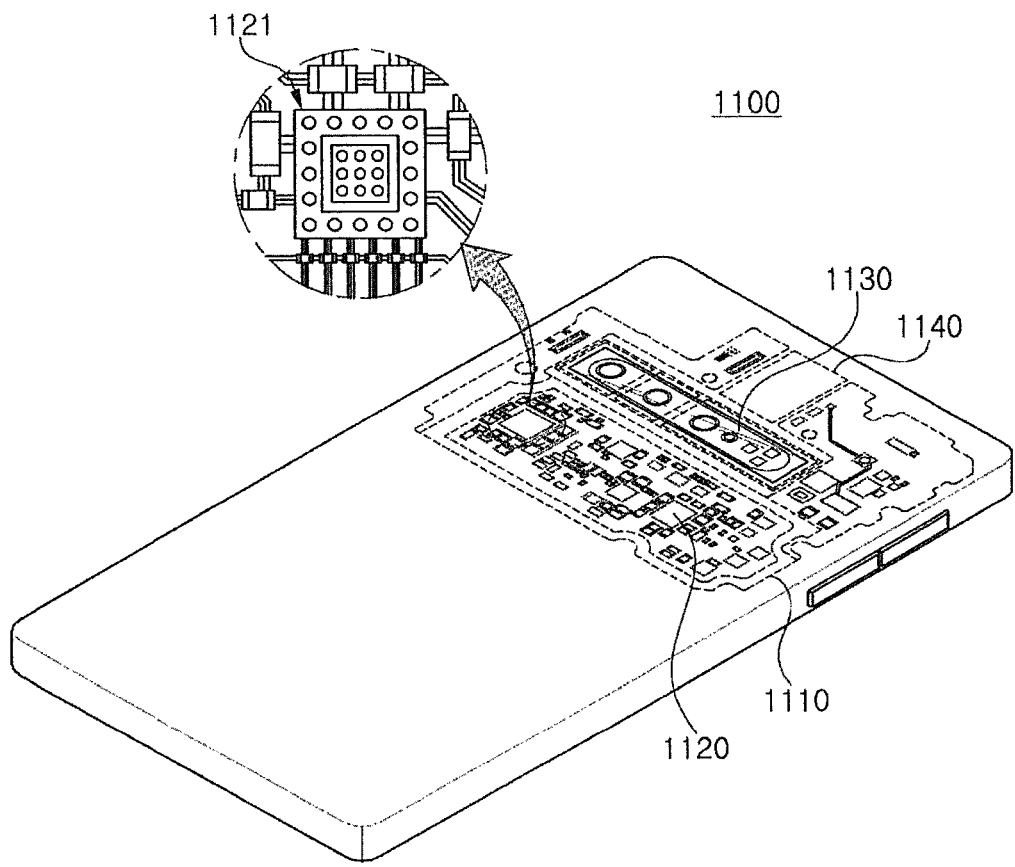
FIG. 2 is a schematic perspective view illustrating an example of an electronic device.

FIG. 2 is a schematic perspective view of a block diagram of an electronic device according to an example.

Referring to FIG. 2, an electronic device may be, for example, a smartphone 1100. A mainboard 1110 may be accommodated in the smartphone 1100, and various electronic components 1120 may be physically and/or electrically connected to the mainboard 1110. In addition, other components that may or may not be physically or electrically connected to the printed circuit board 1110, such as a camera module 1130 and/or a speaker 1140, may be accommodated in the mainboard 1110. A portion of the electronic components 1120 may be chip related components, for example, a semiconductor package 1121, but are not limited thereto. The semiconductor package 1121 may be a surface mounted type, such as a semiconductor chip or a passive component on a package board of a multilayer printed circuit board, but is not limited thereto. Meanwhile, the electronic device is not necessarily limited to the smartphone 1100, but may be other electronic devices as described above.

Printed Circuit Board and Antenna Module

Figure 3:
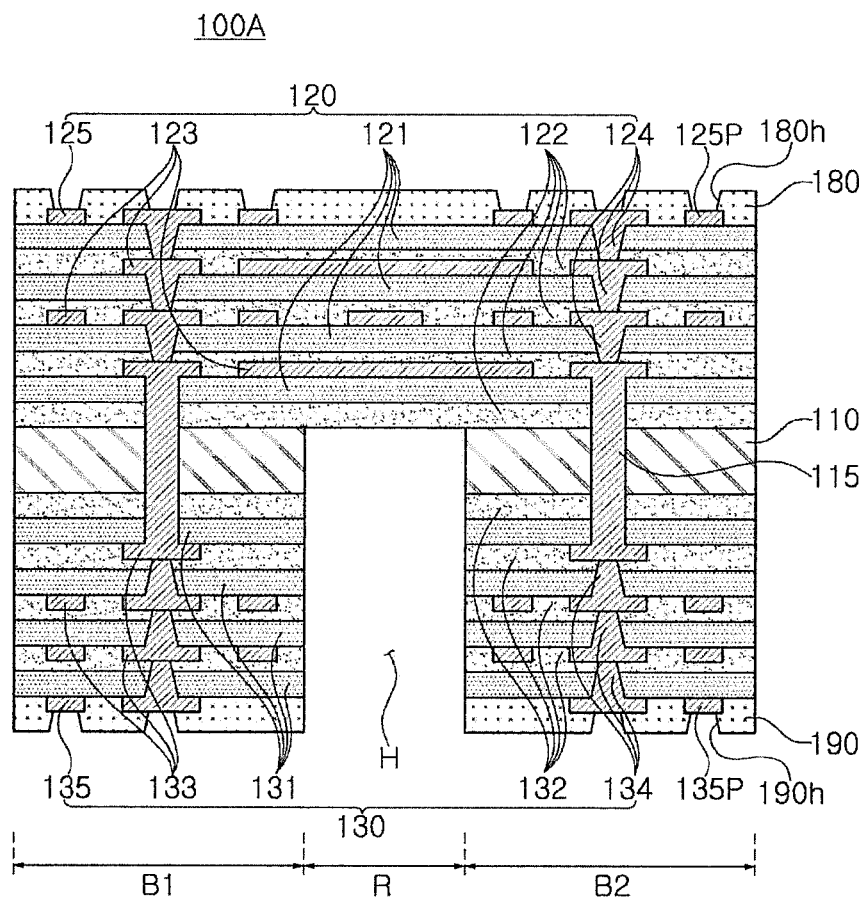
FIG. 3 is a schematic cross-sectional view illustrating an example of a printed circuit board.

FIG. 3 is a schematic cross-sectional view illustrating an example of a printed circuit board.

Referring to FIG. 3, a printed circuit board 100A according to an example includes a core layer 110, a first build-up structure 120 disposed above the core layer 110, and a second build-up structure 130 disposed below the core layer 110. In addition, the printed circuit board 100A according to an example has a through-portion H penetrating through the core layer 110 and the second build-up structure 130, and has a region in which the through-portion H is disposed as a flexible region R. For example, the printed circuit board 100A may include first and second base regions B1 and B2 including the core layer 110 and the first build-up structure 120 and the second build-up structure 130, respectively, and the flexible region R disposed between the first and second base regions B1 and B2 and including the first build-up structure 120 and having the through-portion H. Herein, the flexible region R refers to a region having relatively better bendability than that of the first and second base regions B1 and B2. Meanwhile, in order to provide the flexible region R, the through-portion H may have a form of two side portions facing each other block of four side portions by the core layer 110 of the first and second base regions B1 and B2, the second build-up structure 130, and a second passivation layer 190 to be described later, and remaining two side portions located therebetween may be in an open form.

Meanwhile, the core layer 110 may have a greater modulus of elasticity than each of a first insulating layer 121, a second insulating layer 131, a first bonding layer 122, and a second bonding layer 132. For example, the core layer 110 may be formed of a relatively rigid material, and each of the first insulating layer 121, the second insulating layer 131, the first bonding layer 122, and the second bonding layer 132 may be formed of a relatively flexible material. In this regard, each of the first insulating layer 121, the second insulating layer 131, the first bonding layer 122, and the second bonding layer 132 may not include glass fiber, glass cloth, and glass fabric. In one example, the core layer 110 may include one or more of glass fiber, glass cloth, and glass fabric, so that the core layer 110 may be relatively stiffer as compared to the first insulating layer 121, the second insulating layer 131, the first bonding layer 122, and the second bonding layer 132. Therefore, a through-portion 110H penetrates through the core layer 110 and the second build-up structure 130, bending may be performed by the first build-up structure 120 in the flexible region R. For example, the printed circuit board 100A according to an example may have a form of RFPCB capable of bending.

Meanwhile, the core layer 110 may be relatively thinner, and may have a dielectric loss factor (Df) relatively smaller than a core layer of a conventional multilayer printed circuit board using a copper clad laminate (CCL) or an unclad copper clad laminate (CCL). For example, the core layer 110 may include prepreg having a dielectric loss factor (Df) of 0.003 or less (but exceeding 0). Alternatively, the core layer 110 may include polytetrafluoroethylene (PTFE) or a derivative thereof having a dielectric loss factor (Df) of 0.001 or less (but exceeding 0). Therefore, when forming a through via 115, not only a plated through hole (PTH) but also a laser via may be applied. In this case, the size of upper and lower vias may be maintained at the same level, and a signal transmission loss can be improved by preventing signal bottlenecks. In addition, since a material having a low dielectric loss factor (Df) is used, it is possible to improve the signal transmission loss in a high frequency region, and as described below, it may be usefully used as a substrate for mounting a chip antenna and/or a wireless communication chip.

Meanwhile, each of the first bonding layer 122, the first insulating layer 121, the second bonding layer 132, and the second insulating layer 131 may have a lower dielectric loss factor (Df) than that of a general build-up material such as prepreg, or the like. Thereby, a signal transmission loss in a high frequency domain may be improved more effectively, and as described below, it can be more usefully used as a substrate for mounting a chip antenna and/or a wireless communication chip. For example, each of the first insulating layer 121 and the second insulating layer 131 may include a material having a dielectric loss factor (Df) of 0.002 or less (but exceeding 0), and for example, may include at least one of liquid crystal polymer (LCP), polyimide (PI), cyclo olefin polymer (COP) polyphenylene ether (PPE) polyether ether ketone (PEEK), and PTFE, having a dielectric loss factor (Df) of 0.002 or less (but exceeding 0), or a derivative thereof. In addition, each of the first bonding layer 122 and the second bonding layer 132 may include a material having a dielectric loss factor (Df) of 0.002 or less (but exceeding 0), and for example, may include at least one of an epoxy resin, PPE, and COP, having a dielectric loss factor (Df) of 0.002 or less (but exceeding 0), or a derivative thereof.

Meanwhile, among the above-described materials having the dielectric loss factor (Df), each of the first bonding layers 122 having the first wiring layer 123 embedded therein may have a smaller dielectric loss factor (Df) than each of the first insulating layers 121. Similarly, each of the second bonding layers 132 having the second wiring layer 133 embedded therein may have a smaller dielectric loss factor (Df) than each of the second insulating layers 131. By selecting a combination of these materials, it is possible to more effectively improve signal transmission loss in a high frequency domain.

Meanwhile, the first build-up structure 120 has a form in which the first wiring layer 123 is disposed on the first insulating layer 121 and embedded in the first bonding layer 122, and the second build-up structure 130 has a form in which the second wiring layer 133 is disposed on the second insulating layer 131 and embedded in the second bonding layer 132, such that it is possible to secure close contact and lower roughness relative to a prepreg laminated structure, and as a result, it is possible to improve signal loss.

Meanwhile, the number of alternately stacked layers of the first insulating layer 121 and the first bonding layer 122 may be the same as the number of alternately stacked layers of the second insulating layer 131 and the second bonding layer 132. For example, the first build-up structure 120 and the second build-up structure 130 may have a substantially symmetrical shape in first and second base regions B1 and B2. Through this, it is possible to effectively improve warpage generated in the process or warpage of the product.

Meanwhile, a first bonding layer disposed on a lowermost side of the plurality of first bonding layers 122 may be disposed between the core layer 110 and a first insulating layer 121 disposed on a lowermost side of the plurality of first insulating layers 121. In addition, a second bonding layer 132 disposed on an uppermost side of the plurality of second bonding layers 132 may be disposed between the core layer 110 and a second insulating layer 131 disposed on an uppermost side of the plurality of second insulating layers 131. As described above, since the core layer 110 may be relatively thinner than a core layer of the conventional multilayer printed circuit board, and the dielectric loss factor (Df) thereof may be relatively smaller, the first bonding layer 122 and the second bonding layer 132 may be disposed on upper and lower surfaces of the core layer 110, respectively, and thus, bonding strength and reliability may be improved in this case.

Meanwhile, the first build-up structure 120 may further include a plurality of first wiring via layers 124 penetrating each of the first insulating layers 121, and further penetrating each of the first bonding layers 122 and electrically connecting each of the first wiring layers 123 disposed on different layers and the uppermost wiring layers 125 to each other. In addition, the second build-up structure 130 may further include a plurality of second wiring via layers 134 penetrating through each of the second insulating layers 131, and further penetrating through each of the second bonding layers 132 and electrically connecting each of the second wiring layers 133 disposed on different layers and the lowermost wiring layer 135 to each other. An up-and-down electrical connection path may be provided through the first and second wiring via layers 124 and 134 together with a through via 115. In this case, a wiring via of each of the first wiring vias 124 and a wiring via of each of the second wiring vias 134 may have a tapered shape in opposite directions with respect to the core layer 110. Thereby, it can be seen that a printed circuit board 100A according to example has a double-sided build-up structure.

Meanwhile, the first build-up structure 120 may include an uppermost wiring layer 125 including a plurality of first pads 125P, disposed on an upper surface of the first insulating layer 121 disposed on an uppermost side of the plurality of first insulating layers 121. In addition, the second build-up structure 130 may include a lowermost wiring layer 135 including a plurality of second pads 135P, disposed on a lower surface of the second insulating layer 131 disposed on a lowermost side of the plurality of second insulating layers 131. In this case, a first passivation layer 180 having a plurality of first openings 180h exposing at least a portion of each of the first pads 125P may be disposed on an upper side of the first build-up structure 120, and a second passivation layer 190 having a plurality of second openings 190h exposing at least a portion of each of the second pads 135P may be disposed on a lower side of the second build-up structure 130. As described above, both the upper side and the lower side thereof may have a form capable of mounting parts.

Hereinafter, components of the printed circuit board 100A according to an example will be described in more detail with reference to the accompanying drawings.

The core layer 110 may be disposed at a center portion of the printed circuit board 100A according to an example. The core layer 110 may have a greater elastic modulus than each of the first insulating layer 121, the second insulating layer 131, the first bonding layer 122, and the second bonding layer 132. For example, the core layer 110 may be composed of a relatively rigid material. The core layer 110 may be relatively thinner than the core layer of the conventional multilayer printed circuit board, and the dielectric loss factor (Df) thereof may be relatively smaller. For example, the core layer 110 may include prepreg having a dielectric loss factor (Df) of 0.003 or less (but exceeding 0). Alternatively, the core layer 110 may include PTPE having a dielectric loss factor (Df) of 0.001 or less (but exceeding 0) or a derivative thereof. However, the present disclosure is not limited thereto, and other suitable materials having a thin thickness and a low dielectric loss factor may be used as the material of the core layer 110.

As the through via 115, not only a PTH-type via but also a laser via may be applied. A metal material may be used as the material of the through via 115, and in this case, the metal material may be copper (Cu), aluminum (Al), silver (Ag), tin (Sn), gold (Au), nickel (Ni), lead (Pb), titanium (Ti), or alloys thereof. The through via 115 may be a filled-type via filled with such a metal material. The through via 115 may penetrate the core layer 110, and may further penetrate the lowermost first bonding layer 122 and the lowermost first insulating layer 121 and the uppermost second bonding layer 132 and the uppermost second insulating layer 131. Through this, the first wiring layer 123 disposed on the lowermost side of the plurality of first wiring layers 123 and the second wiring layer 133 disposed on the uppermost side of the plurality of second wiring layers 133 may be electrically connected to each other. The through via 115 may perform various functions according to a design. For example, the though via 115 may include a connection via for signal connection, a connection via for ground connection, a connection via for power connection, and the like. The connection via for ground connection and the connection via for power connection may be the same connection via. The through via 115 may have a cylindrical shape, but is not limited thereto, as described below.

Each of the first insulating layer 121 and the second insulating layer 131 may be disposed as a build-up layer. Each of the first insulating layer 121 and the second insulating layer 131 may have a smaller elastic modulus than the core layer 110. For example, the first insulating layer 121 and the second insulating layer 131 may be comprised of a relatively flexible material. The first insulating layer 121 and the second insulating layer 131 may include a material having a dielectric loss factor (Df) of 0.002 or less (but exceeding 0), respectively, and for example, may include at least one LCP, PI, COP, PPE, PEEK, and PTFE, having a dielectric loss factor (Df) of 0.002 or less (but exceeding 0), or a derivative thereof.

Each of the first bonding layer 122 and the second bonding layer 132 may be disposed as a layer for bonding the core layer 110, the first insulating layer 121, and the second insulating layer 131, disposed on different layers. Each of the first bonding layer 122 and the second bonding layer 132 may also have a smaller elastic modulus than the core layer 110. For example, the first bonding layer 122 and the second bonding layer 132 may also be made of a relatively flexible material. Each of the first insulating layer 121 and the second insulating layer 131 may include a material having a dielectric loss factor (Df) of 0.002 or less (but exceeding 0), and for example, may include at least one of an epoxy-based resin, PPE, and COP having a dielectric loss factor (Df) of 0.002 or less (but exceeding 0), or a derivative thereof.

Meanwhile, the first insulating layer 121 and the first bonding layer 122 may be formed of a first build-up layer, and the first build-up structure 120 may include the first build-up layer as a plurality of layers. The first wiring layer 123 may be disposed on the first build-up layer, respectively. The first wiring via layer 124 may penetrate the first build-up layer, respectively. The second insulating layer 131 and the second bonding layer 132 may be formed of a second build-up layer, and the second build-up structure 130 may include the second build-up layer as a plurality of layers. The second wiring layer 133 may be disposed on the second build-up layer, respectively. The second wiring via layers 134 may penetrate through the second build-up layer, respectively.

Each of the first wiring layer 123, the second wiring layer 133, the uppermost wiring layer 125, and the lowermost wiring layer 135 may provide various wirings. Metal material may be used as these materials, and as the metal materials, copper (Cu), aluminum (Al), silver (Ag), tin (Sn), gold (Au), nickel (Ni), lead (Pb), and titanium (Ti), alloys thereof, and the like may be used. They may perform various functions based on designs of the corresponding layers, respectively. For example, a ground pattern, a power pattern, a signal pattern, and the like may be included. Here, the signal pattern may include various signals except for a ground pattern, a power pattern, and the like, for example, a data signal, an antenna signal, or the like. For example, the signal pattern may be used as a feeding line of the antenna. If necessary, the ground pattern and the power pattern may be the same pattern. These patterns may include a line pattern, a plane pattern, and/or a pad pattern, respectively.

The first wiring via layer 124 and the second wiring via layer 134 may provide upper and lower electrical connection paths to the first build-up structure 120 and the second build-up structure 130, respectively. Metal materials may be used as these materials, and as the metal materials, copper (Cu), aluminum (Al), silver (Ag), tin (Sn), gold (Au), nickel (Ni), lead (Pb), and titanium (Ti), alloys thereof, and the like may be used. These may also perform various functions depending on designs of the corresponding layers. For example, a connection via for signal connection, a connection via for ground connection, a connection via for power connection, and the like may be included. The connection via for ground connection and the connection via for power connection may be the same connection via. Wiring vias of each of the first wiring via layers 124 and wiring vias of each of the second wiring via layers 134 may have a tapered shape in opposite directions with respect to the core layer 110. For example, the wiring vias of each of the first wiring via layers 124 may have a tapered shape in which an upper width is wider than a lower width onto a cross-section. In addition, each of the wiring vias of the second wiring via layer 134 may have a tapered shape in which a lower width of the second wiring via layer 134 is wider than an upper width onto a cross-section. The wiring vias of each of the first wiring via layers 124 and the second wiring via layers 134 may be completely filled with a metal material, or the metal material may be formed along a wall surface of the via hole. In addition, they may be in a stacked via relationship with each other or may be in a staggered via relationship.

A first passivation layer 180 and a second passivation layer 190 may protect an internal configuration of the printed circuit board 100A according to an example from external physical and chemical damages. The first passivation layer 180 and the second passivation layer 190 may include a thermosetting resin and an inorganic filler. For example, the first passivation layer 180 and the second passivation layer 190 may be ABF, respectively. However, the present disclosure is not limited thereto, the first passivation layer 180 and the second passivation layer 190 may be a known photosensitive insulating layer, for a solder resist (SD) layer, respectively. The first passivation layer 180 and the second passivation layer 190 may include the same kind of material, and may have substantially the same thickness, as each other. However, the present disclosure is not limited thereto, and may include different kinds of materials, and may have different thicknesses. The first passivation layer 180 and the second passivation layer 190 may each have a plurality of first openings 180h and a plurality of second openings 190h, which may each expose at least a portion of each of a plurality of first pads 125P and a plurality of second pads 135P from the first passivation layer 180 and the second passivation layer 190. Meanwhile, a surface treatment layer may be formed on the exposed surfaces of the plurality of first pads 125P and the plurality of second pads 135P, respectively. The surface treatment layer may be formed by, for example, electrolytic gold plating, electroless gold plating, OSP or electroless tin plating, electroless silver plating, electroless nickel plating/substituted plating, DIG plating, HASL, or the like. If necessary, each opening may be composed of a plurality of via holes.

Figure 4:
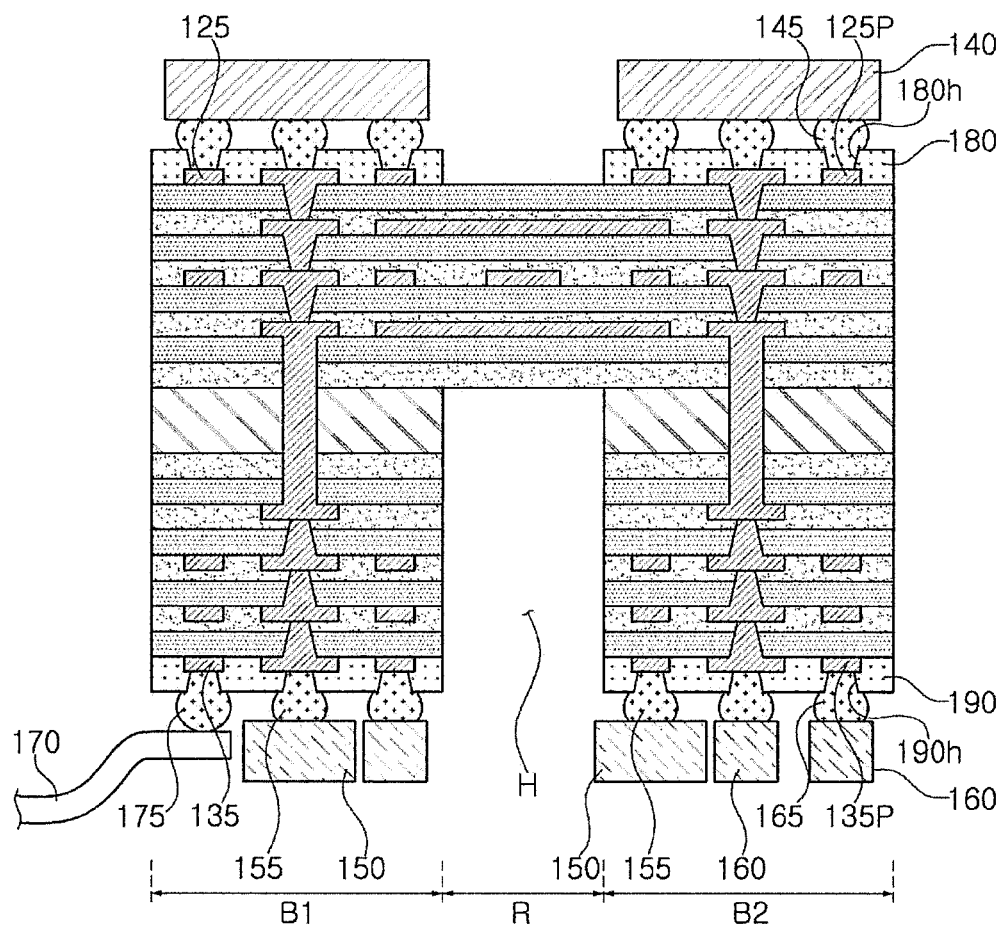
FIG. 4 is a schematic cross-sectional view illustrating an example of an antenna module.

FIG. 4 is a schematic cross-sectional view illustrating an example of an antenna module.

Referring to FIG. 4, in the printed circuit board 100A according to the above-described example, an antenna module 100B according to an example further includes a chip antenna 140 disposed above the first passivation layer 180 and connected to at least one of the plurality of first pads 125P through a first electrical connection metal 145 and a wireless communication chip 160 disposed below the second passivation layer 190 and connected to at least one of the plurality of second pads 135P through a second electrical connection metal 155. If necessary, an electronic component 160 disposed below the second passivation layer 190 and connected to at least the other one of the plurality of second pads 135P through a third electrical connection metal 165 may be further included. In addition, if necessary, a connector 170 disposed below the second passivation layer 190 and connected to at least the other one of the plurality of second pads 135P through a fourth electrical connection metal 175 may be further included.

The chip antenna 140 may be various types of chip type components including an antenna pattern. For example, the chip antenna 140 may be a chip type patch antenna or a chip type dipole antenna. The chip antenna 140 may include a dielectric layer, an antenna pattern such as a patch antenna pattern and/or a dipole antenna pattern formed in the dielectric layer, and a feeding line formed in the dielectric layer. The chip antenna 140 may also include a ground pattern therein as necessary. However, the type of the chip antenna 140 is not limited thereto, and may be a package type as necessary. The chip antenna 140 may be disposed in surface mounting form. The chip antenna 140 may be a ceramic chip depending on an internal material. Alternatively, the chip antenna 140 may be a chip including an internal material having a dielectric constant (Dk) of 5 or higher containing PTFE and a ceramic filler. However, the internal material is not limited thereto.

The wireless communication chip 150 may be various types of chip type components capable of performing a communication function. For example, the wireless communication chip 150 may be an RFIC die, or a package including an RFIC die. The package including the RFIC die may include, for example, a molding member for molding the RFIC die, a connection member including a redistribution layer for redistributing connection pads of the RFIC die, and the like. The wireless communication chip 150 may be signally connected to the chip antenna 140 through a signal transmission path inside the printed circuit board of the antenna module 100B. The wireless communication chip 150 may also be disposed in surface mounting form.

The electronic component 160 may be various types of active components and/or passive components. For example, the electronic component 160 may be various types of integrated circuit (IC) dies. Alternatively, the electronic component 160 maybe a semiconductor package including an integrated circuit (IC) die. Alternatively, the electronic component 160 may be a passive component in a form of a chip such as a chip capacitor such as a multilayer ceramic capacitor (MLCC), a chip inductor such as a power inductor (PI), or the like. Alternatively, the electronic component 160 may be a silicon capacitor. As such, the kind of the electronic component 160 is not particularly limited. The electronic component may be electrically connected to the chip antenna 140 and/or the wireless communication chip 150 through a wiring path inside the printed circuit board of the antenna module 100B. The electronic component 160 may be disposed in surface mounting form.

A connector 170 may connect the printed circuit board of the antenna module 100B according to another example with other external components. The connector 170 is nor particularly limited as long as physical and electrical connections are possible, and various types of connectors known in the art may be applied. The connector 170 may have a flexible property.

Electrical connection metals 145, 155, 165, and 175 may provide a physical and/or electrical connection path. The electrical connection metals 145, 155, 165, and 175 may include a low melting point metal having a lower melting point than copper (Cu), respectively, for example, may include tin (Sn) or an alloy including tin (Sn). For example, it may be formed of solder, but this is merely an example. The material thereof is not particularly limited thereto. The electrical connection metals 145, 155, 165, and 175 may be lands, balls, pins, or the like. The electrical connection metals 145, 155, 165, and 175 may be formed of a multilayer or single layer. When the electrical connection metals 145, 155, 165, and 175 are formed of a plurality of layers, the electrical connection metals may include a copper pillar and a solder. When the electrical connection metals 145, 155, 165, and 175 are formed of the single layer, the electrical connection metals 145, 155, 165, and 175 may include a tin-silver solder, but this is a merely an example, but the present disclosure is not limited thereto. The number, an interval, a dispositional form, and the like, of the electrical connection metals 145, 155, 165, and 175 are not particularly limited, but may be sufficiently modified depending on design particulars.

Figure 5:
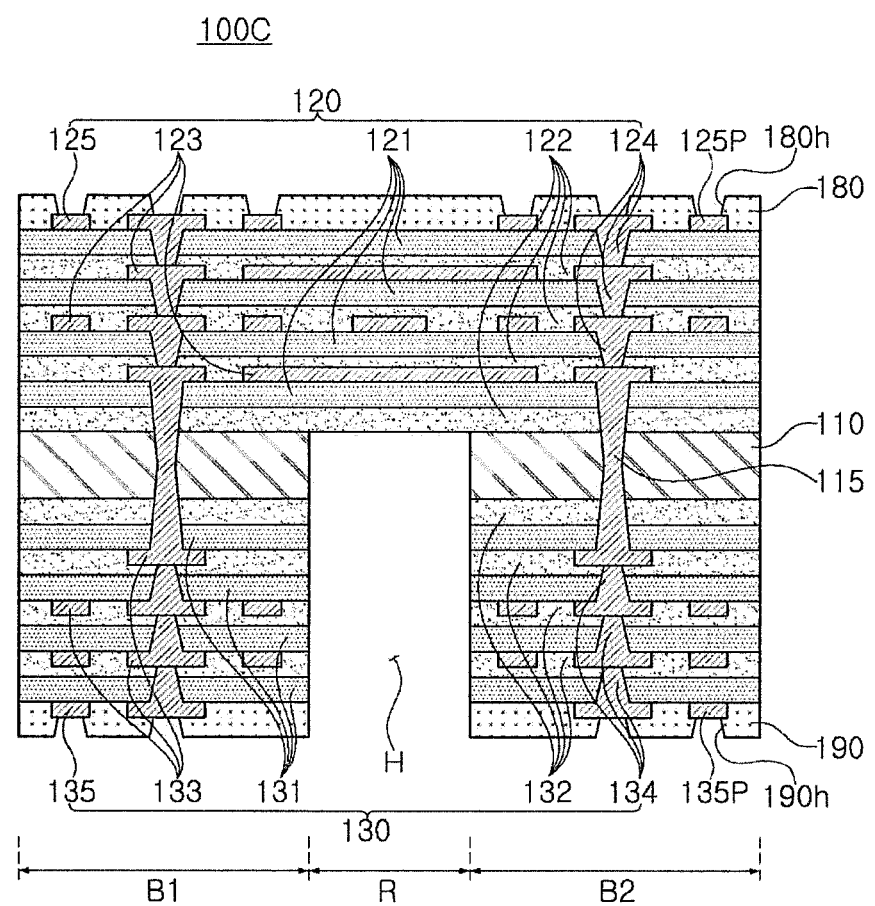
FIG. 5 is a schematic cross-sectional view illustrating another example of a printed circuit board.

FIG. 5 is a schematic cross-sectional view illustrating another example of a printed circuit board.

Figure 6:
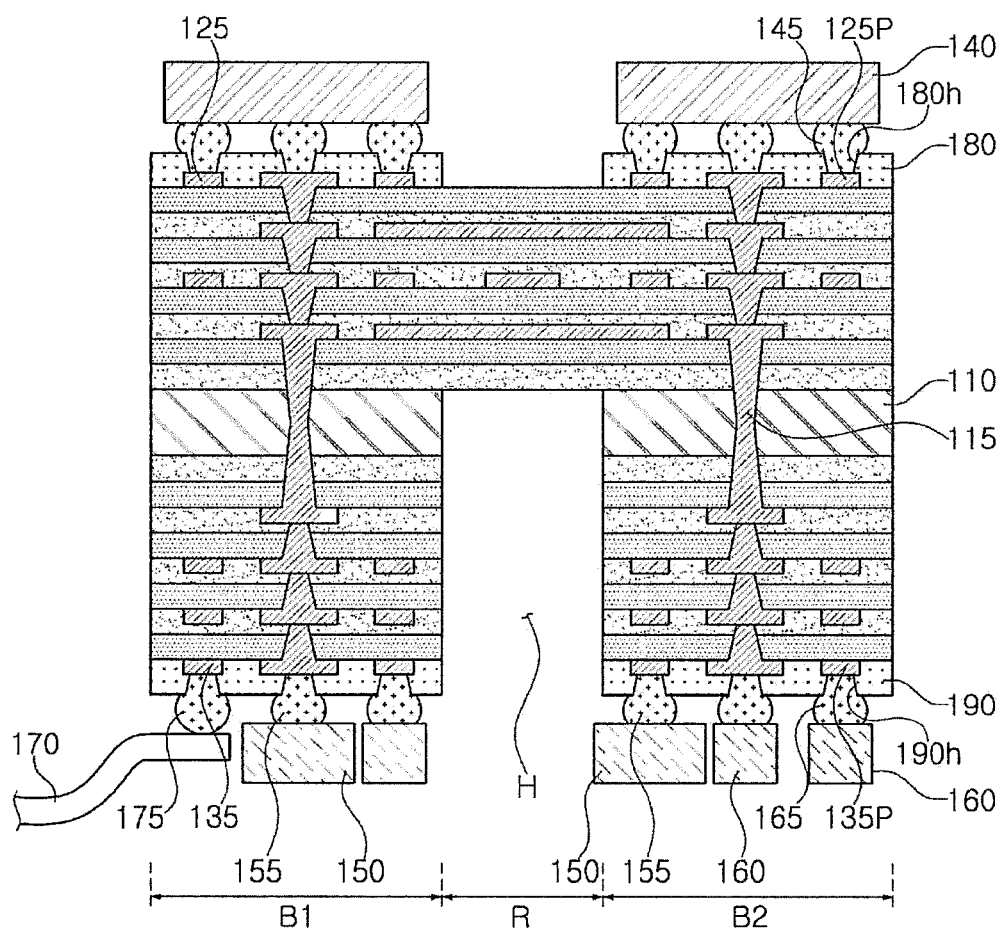
FIG. 6 is a cross-sectional view illustrating another example of an antenna module.

FIG. 6 is a schematic cross-sectional view illustrating another example of an antenna module.

Referring to FIGS. 5 and 6, a printed circuit board 100C according to another example and an antenna module 100D according to another example has an hourglass shape of the through via 115, as compared to the printed circuit board 100A according to the above-described example and an antenna module 100B according to an example. As such, when the through via 115 is formed, since not only PTH but also a laser via may be applied, the through via 115 may have an hourglass shape, or the like. Even in this case, the through via 115 may be a field-type via filed with a metal material. On the other hand, by having such a shape, it is possible to maintain the size of the upper and lower vias to the same level, and it is possible to improve a signal transmission loss through prevention of single bottlenecks. Other descriptions are substantially the same as those described above, and detailed descriptions thereof will be omitted.

As set forth above, as one of several effects of the present disclosure, a printed circuit board that can be antenna modularized by placing a chip antenna and a wireless chip in a surface-mounted form, and can be used as a rigid flexible printed circuit board (RFPCB), having a flexible area, and an antenna module using such a printed circuit board may be provided.

As another effect among the various effects of the present disclosure, the provided printed circuit board may have a relatively thin and simple structure.

As another effect among the various effects of the present disclosure, the provided printed circuit board may have a low dielectric loss rate.

As another effect among various effects of the present disclosure, the provided printed circuit board may improve signal loss.

As another effect among the various effects of the present disclosure, the provided printed circuit board may have a simple process and reduce manufacturing costs and durations.

As another effect among the various effects of the present disclosure, the provided printed circuit board may be manufactured in excellent yield.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no elements or layers intervening therebetween. Like numerals refer to like elements throughout. As used herein, the term "and/or" includes any and all combinations of one or more of the associated listed items. It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

The terminology used herein describes particular embodiments only, and the present disclosure is not limited thereby. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

While exemplary embodiments have been shown and described above, it will be apparent to those skilled in the art that modifications and variations could be made without departing from the scope of the present invention as defined by the appended claims.

What is claimed is:

1. A printed circuit board, comprising:
a core layer;
a first build-up structure disposed on an upper side of the core layer, including first insulating layers and first bonding layers, alternately stacked, and further including first wiring layers disposed on upper surfaces of the first insulating layers, respectively and embedded in one or more of the first bonding layers, respectively; and
a second build-up structure disposed on a lower side of the core layer, including second insulating layers and second bonding layers, alternately stacked, and further including second wiring layers disposed on lower surfaces of the second insulating layers, respectively and embedded in one or more of the second bonding layers, respectively,
wherein the printed circuit board has a through-portion penetrating through the core layer and the second build-up structure, and has a region in which the through-portion is disposed as a flexible region,
one of the first bonding layers in contact with the core layer is spaced apart from the first wiring layers,
a lowermost one of the first wiring layers, which is closer to the core layer than the remaining of the first wiring layers, is disposed on one of the first insulating layers and is in contact with the one of the first insulating layers, the one of the first insulating layers being closer to the core layer than the remaining of the insulating layers,
one of the second bonding layers in contact with the core layer is spaced apart from the second wiring layers, and
an uppermost one of the second wiring layers, which is closer to the core layer than the remaining of the second wiring layers, is disposed on one of the second insulating layers and is in contact with the one of the second insulating layers, the one of the second insulating layers being closer to the core than the remaining of the second insulating layers.

2. The printed circuit board of claim 1, wherein the core layer has a greater elastic modulus than each of the first insulating layers, the second insulating layers, the first bonding layers, and the second bonding layers.

3. The printed circuit board of claim 1, wherein the core layer comprises at least one selected from a group consisting of prepreg having a dielectric loss factor (Df) of 0.003 or less, polytetrafluoroethylene (PTFE) having a dielectric loss factor (Df) of 0.001 or less, and a derivative of the PTFE.

4. The printed circuit board of claim 1, wherein each of the first and second insulating layers comprises at least one of liquid crystal polymer (LCP), polyimide (PI), cyclo olefin polymer (COP), polyphenylene ether (PPE), polyether ether ketone (PEEK), and PTFE, having a dielectric loss factor (Df) of 0.002 or less, or at least one derivative thereof.

5. The printed circuit board of claim 1, wherein each of the first and second bonding layers comprises at least one of an epoxy-based resin, PPE, and COP, having a dielectric loss factor (Df) of 0.002 or less, or at least one derivative thereof.

6. The printed circuit board of claim 1, wherein each of the first bonding layers has a lower dielectric loss factor (Df) than each of the first insulating layers, and each of the second bonding layers has a lower dielectric loss factor (Df) than each of the second insulating layers.

7. The printed circuit board of claim 1, wherein the number of alternately stacked layers of the first insulating layers and the first bonding layers is the same as the number of alternately stacked layers of the second insulating layers and the second bonding layers.

8. The printed circuit board of claim 1, wherein the one of the first bonding layers in contact with the core layer is a first bonding layer disposed on a lowermost side of the first bonding layers to be between the core layer and a lowermost first insulating layer, among the first insulating layers, disposed on a lowermost side of the first insulating layers, and
a second bonding layer disposed on an uppermost side of the second bonding layers is disposed between the core layer and a second insulating layer disposed on an uppermost side of the second insulating layer.

9. The printed circuit board of claim 8, further comprising a through via penetrating through the core layer, the lowermost first bonding layer, the lowermost first insulating layer, the uppermost second bonding layer, and the uppermost second insulating layer, and connecting a first wiring layer disposed on a lowermost side of the first wiring layers and a second wiring layer disposed on an uppermost side of the second wiring layers,
wherein the through via is filled with a metal material.

10. The printed circuit board of claim 1, wherein the first build-up structure further comprises first wiring via layers penetrating through each of the first insulating layers and further penetrating through each of the first bonding layers to connect the first wiring layers, disposed on different layers, to each other, and
the second build-up structure further comprises second wiring via layers penetrating through each of the second insulating layers and further penetrating through each of the second bonding layers to connect the second wiring layers, disposed on different layers, to each other.

11. The printed circuit board of claim 10, wherein wiring vias of each of the first wiring via layers and wiring vias of each of the second wiring via layers have a tapered shape in opposite directions with respect to the core layer.

12. The printed circuit board of claim 1, wherein the first build-up structure further comprises an uppermost wiring layer including first pads, disposed on an upper surface of the first insulating layer disposed on an uppermost side of the first insulating layers, and
the second build-up structure further comprises a lowermost wiring layer including second pads, disposed on a lower surface of the second insulating layer disposed on a lowermost side of the second insulating layers.

13. The printed circuit board of claim 12, further comprising a first passivation layer disposed on an upper side of the first build-up structure, and having a plurality of first openings exposing at least a portion of each of the first pads, and
a second passivation layer disposed on a lower side of the second build-up structure, and having a plurality of second openings exposing at least a portion of each of the second pads.

14. The printed circuit board of claim 1, wherein each of the first insulating layers and the first bonding layers continuously extends over the flexible region.

15. The printed circuit board of claim 1, further comprising:
a passivation layer having openings exposing a portion of pads of an uppermost one of the first wiring layers,
wherein the openings are spaced apart from the flexible region.

16. The printed circuit board of claim 15, wherein each of the first insulating layers and the first bonding layers continuously extends over the flexible region.

17. The printed circuit board of claim 15, wherein the number of the first insulating layers and the first bonding layers is the same as the number of the second insulating layers and the second bonding layers.

18. An antenna module, comprising:
a printed circuit board comprising:
a base region including:
a core layer,
a first build-up structure disposed on an upper side of the core layer, including first insulating layers and first bonding layers, alternately stacked, and further including first wiring layers disposed on upper surfaces of the first insulating layers, respectively and embedded in one or more of the first bonding layers, respectively, and
a second build-up structure disposed on a lower side of the core layer, including second insulating layers and second bonding layers, alternately stacked, and further including second wiring layers disposed on lower surfaces of the second insulating layers, respectively and embedded in one or more of the second bonding layers, respectively, and
a flexible region including the first insulating layers, the first bonding layers, and the first wiring layers, and having a through-portion penetrating through the core layer, the second insulating layers, and the second bonding layers,
wherein the core layer has a greater elastic modulus than each of the first insulating layers, the first bonding layers, the second insulating layers, and the second bonding layers, and
a portion of one of the first insulating layers and the first bonding layers is provided as a boundary of the through-portion and the first wiring layers are spaced apart from the boundary of the through-portion; and
an electronic component disposed on the base region of the printed circuit board,
wherein the electronic component comprises a component including an antenna,
one of the first bonding layers in contact with the core layer is spaced apart from the first wiring layers,
a lowermost one of the first wiring layers, which is closer to the core layer than the remaining of the first wiring layers, is disposed on one of the first insulating layers and is in contact with the one of the first insulating layers, the one of the first insulating layers being closer to the core layer than the remaining of the first insulating layers, one of the second bonding layers in contact with the core layer is spaced apart from the second wiring layers, and an uppermost one of the second wiring layers, which is closer to the core layer than the remaining of the second wiring layers, is disposed on one of the second insulating layers and is in contact with the one of the second insulating layers, the one of the second insulating layers being closer to the core layer than the remaining of the second insulating layers.

19. The antenna module of claim 18, wherein the electronic component further comprises an active component and a passive component disposed on the base region of the printed circuit board, the component including the antenna is disposed on an upper side of the based region of the printed circuit board, and the active component and the passive component are disposed on at least one of the upper side and a lower side of the base region of the printed circuit board, respectively.

20. The antenna module of claim 19, further comprising a connector connected to the lower side of the base region of the printed circuit board.

* * * * *